United States Patent
Bellora (12)

(10) Patent No.: US 6,433,276 B1
(45) Date of Patent: Aug. 13, 2002

(54) SURFACE MOUNT FEEDTHROUGH

(76) Inventor: John Bellora, 5220 Fiore Ter. Apt 301, San Diego, CA (US) 92122

( * ) Notice: Subject to any disclaimer, the term of this patent is extended or adjusted under 35 U.S.C. 154(b) by 0 days.

(21) Appl. No.: 09/681,297

(22) Filed: Mar. 14, 2001

(51) Int. Cl.⁷ ................................................. H01J 15/00
(52) U.S. Cl. ............................. 174/50.61; 174/152 GM
(58) Field of Search ............................ 174/50.61, 50.5, 174/50.55, 50.63, 152 GM, 17.08, 135, 257, 50.56, 50.62, 52.2; 439/488, 491, 79, 80; 29/842, 845; 361/302

(56) References Cited

U.S. PATENT DOCUMENTS

| | | | | |
|---|---|---|---|---|
| 3,154,631 A | * | 10/1964 | Mauviel .................... 174/52.2 |
| 3,155,766 A | * | 11/1964 | Eichert et al. ................. 174/61 |
| 4,050,769 A | * | 9/1977 | Ammon ................. 339/196 M |
| 4,737,601 A | * | 4/1988 | Gartzke ............... 174/152 GM |
| 4,841,101 A | * | 6/1989 | Pollock ............... 174/152 GM |
| 4,940,858 A | * | 7/1990 | Taylor et al. ......... 174/152 GM |
| 5,032,085 A | * | 6/1991 | Alwine et al. ................. 439/79 |
| 5,076,795 A | * | 12/1991 | Kruup et al. .................. 439/79 |
| 5,104,755 A | * | 4/1992 | Taylor et al. ................ 429/181 |
| 5,175,067 A | * | 12/1992 | Taylor et al. ................ 429/181 |
| 5,333,095 A | * | 7/1994 | Stevenson et al. .......... 29/25.42 |
| 5,709,724 A | * | 1/1998 | Naugler et al. ............... 65/59.4 |
| 5,743,765 A | * | 4/1998 | Andrews et al. ............. 439/608 |
| 5,896,267 A | * | 4/1999 | Hittman et al. ............. 29/25.42 |
| 5,905,627 A | * | 5/1999 | Brendel et al. .............. 333/182 |
| 6,068,494 A | * | 5/2000 | Tokuma ....................... 439/79 |
| 6,275,369 B1 | * | 8/2001 | Stevenson et al. ........... 361/302 |

* cited by examiner

*Primary Examiner*—Dean A. Reichard
*Assistant Examiner*—Angel R. Estrada
(74) *Attorney, Agent, or Firm*—Michael L Greenberg; Greenberg & Lieberman

(57) ABSTRACT

A microcircuit package feedthrough that relates to glass-to-metal seals, and more particularly, to feedthroughs for use in surfacemount microcircuit packages. The present invention can be used with surface mount technology such that it is a microcircuit package feedthrough that requires fewer manufacturing steps to install than conventional feedthroughs.

12 Claims, 2 Drawing Sheets

SURFACE MOUNT FEEDTHROUGH

BACKGROUND OF INVENTION

Many types of microcircuits are enclosed in electrically conductive, metallic or metallic-clad ceramic packages. Conductive packages are used because they provide a shield from ambient electrical noise that can cause the internal circuit to generate erroneous signals. The leads or pins which allow the electronic signals into and out of the package must be electrically isolated from the package itself. An insulator, typically of glass, between the lead and package, is one solution to the problem of isolation. Known in the industry as a glass-to-metal seal, the insulator can also provide a hermetic seal between the lead and package to prevent contamination of the internal circuit.

For several reasons, many glass-to-metal seals are constructed independently of the package and then permanently bonded into holes in the package walls. This independent device is called a feedthrough. In many cases, it is more efficient to bore holes in a package wall, insert feed throughs, and bond them into place than it is to design and make the complicated fixtures necessary to construct the glass-to-metal seal directly in the package. This is especially true where a relatively small number of the microcircuits are to be manufactured.

Another reason is weight. If it is desired to maintain the hermetic seal of the insulator in a wide range of ambient temperatures the package can be constructed from Kovar (a trademark of Carpenter Technology Corporation), which is an alloy that has a coefficient of expansion the same as that of heat-resistant glass, the typical insulating material. Thus, as the temperature rises, the glass insulator and Kovar package expand at the same rate maintaining the hermetic seal. The problems with Kovar housings include: 1)unavailability of custom sizes and 2) difficulty in machining, resulting in expensive setup and tooling charges compared to aluminum, even for standard size housings. Additionally, Kovar is heavy. In some applications, particularly aircraft- and spacecraft-related applications weight is of prime importance—consequently, a lowerweight material, such as aluminum is preferred for the package. However, aluminum has a coefficient of expansion greater than that of glass. So in order to provide hermetic seals in aluminum packages, feedthroughs are used and installed through the use of solder- or epoxy.

The feedthrough consists generally of a conductive ferrule, a conductive lead extending through the ferrule and spaced from the ferrule edges, and an insulator, typically heat-resistant glass, holding the lead in places isolating it from the ferrule, and providing a hermetic seal. There are two basic types of feedthroughs, matched and compression a matched feedthrough, the materials used for the ferrule, insulator, and lead have essentially the same coefficient of expansion. This keeps the hermetic seal intact during temperature changes, both during manufacture and in use. In the compression seal, the coefficient of expansion of the ferrule is greater than that of the insulator, so that as the feedthrough cools during manufacture, it contracts more than the insulator, compressing the insulator against the lead.

Leads can exit vertically through the floor of the microcircuit package. Vertical leads can be plugged into sockets, printed circuit boards, or other connecting devices. They can be soldered, clamped, or otherwise hardwired into vias on the circuit board. They can also be bent at right angles to extend out from under the package and soldered to pads or vias on circuit boards, for example, when using surface mount technology (SMT). The major disadvantage to this use is that, unless the leads extend vertically a short distance before being bent outwardly, they will make electrical contact with the package edge, causing a short circuit that prevents the microcircuit from operating properly. If the vertical portion is not long enough, the lead can be short-circuited to the package by the solder that connects the lead to the circuit board. If the vertical portion is too long, the package may stand too high on the circuit board or may be susceptible to being bend over, which can also cause short circuits.

Alternatively, leads can exit horizontally through the side walls of the microcircuit package. Leads that exit horizontally can also be plugged into sockets, but are normally provided for SMT. When used for SMT, the leads extend horizontally from the package a short distance so they do not short against the package, are bent downwardly to the circuit board, and then are bent outwardly along the circuit board. One disadvantage is that the leads must be bent, which is an extra step in the manufacturing process. The major disadvantage, however, is that these leads use up a significant amount of valuable circuit board area. The amount that the lead must extend horizontally from the package before being bent downwardly increases the circuit board surface area needed to accommodate the package, meaning that the circuit board must be larger to provide the same functionality. Additionally, the exposed horizontal lead causes unwanted inductance in high frequency and wide band circuits. Also, the horizontal lead functions as an antenna that transmits energy, affecting other components.

The current solution to the SMT problem is to manufacture right-angle glass-to-metal seals directly in the package. The right-angle lead exits the package through a notch in the edge of the package so that the lead is flush with the circuit board. However, the manufacturing efficiency and package weight problems associated with these direct glass-to-metal seals described above remain.

SUMMARY OF INVENTION

An object of the present invention is to provide a microcircuit package feedthrough that can be used with surface mount technology.

Another object is to provide a microcircuit package feedthrough that significantly reduces the possibility of a short circuit between the lead and package when used with SMT.

Yet another object is to provide a microcircuit package feedthrough that uses less circuit board area for SMT than conventional feedthroughs of the present art.

A further object is to provide a microcircuit package feedthrough that requires fewer manufacturing steps to install than conventional feedthroughs.

Another object is feedthrough cost effectiveness, compared to other designs.

Another object of the present invention is that it allows circuits to be used with SMT, otherwise unavailable in circuits incorporating kovar package housings, inter digital, combine, high frequency, wide band cavity and ceramic circuits.

Another object is that the feedthrough dimensions allow a 50 ohm impedance to be provided DC to 16 gigahert, compared to full packages limited to 1 GHz.

Other objects of the present invention will become apparent in light of the following drawings and detailed description of the invention.

DETAILED DESCRIPTION

The feedthrough of the present invention provides a hermetic, glass-to-metal seal with a right-angle lead. The preferred embodiment 10 is shown in FIGS. 1–5, and includes a ferrule 12, a lead 14, and an insulator 16.

The ferrule 12 is essentially a ring of electrically-conductive material, typically a metal. As described above, there are two general classes of feedthroughs, matched and compression. For matched feedthroughs, the ferrule is preferably composed of a low-coefficient-of-expansion metal, such as Kovar. Kovar is an alloy of 29% nickel, 17% cobalt, 0.3% manganese, and the remainder iron, which has a coefficient of expansion comparable to that of heat-resistant glass, a typical insulator material, as discussed below. When a compression feedthrough is desired, other conductive materials known in the glass-to-metal seal art that have an coefficient of expansion that is greater than that of the insulator material are contemplated for example stainless steel when used with a glass insulator.

Figure 1:
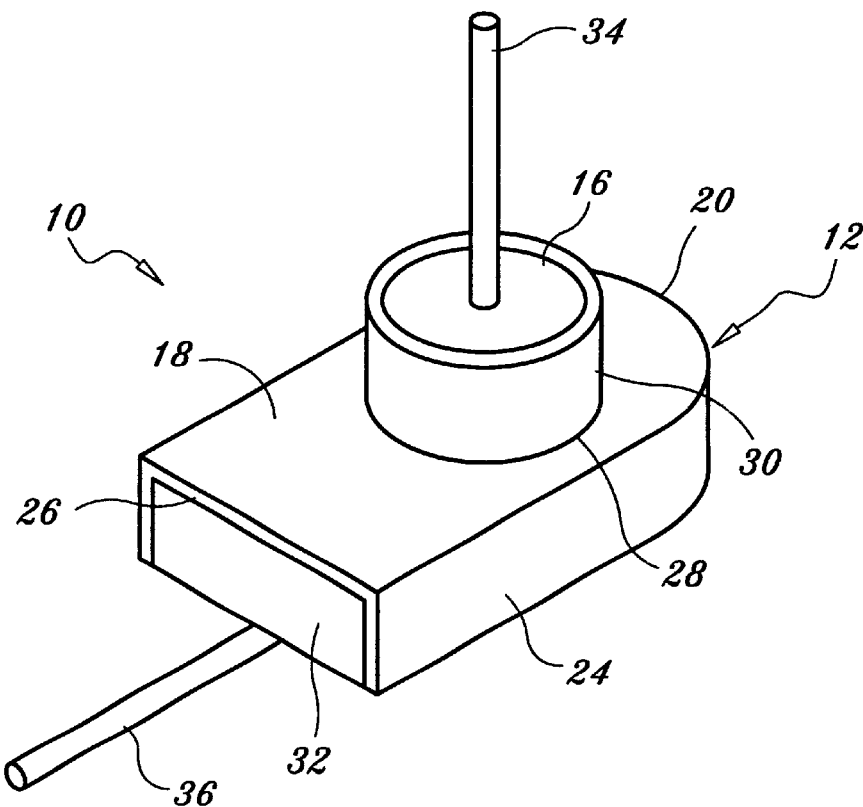
FIG. 1 shows a perspective view of the top of the preferred embodiment of the present invention.
Figure 2:
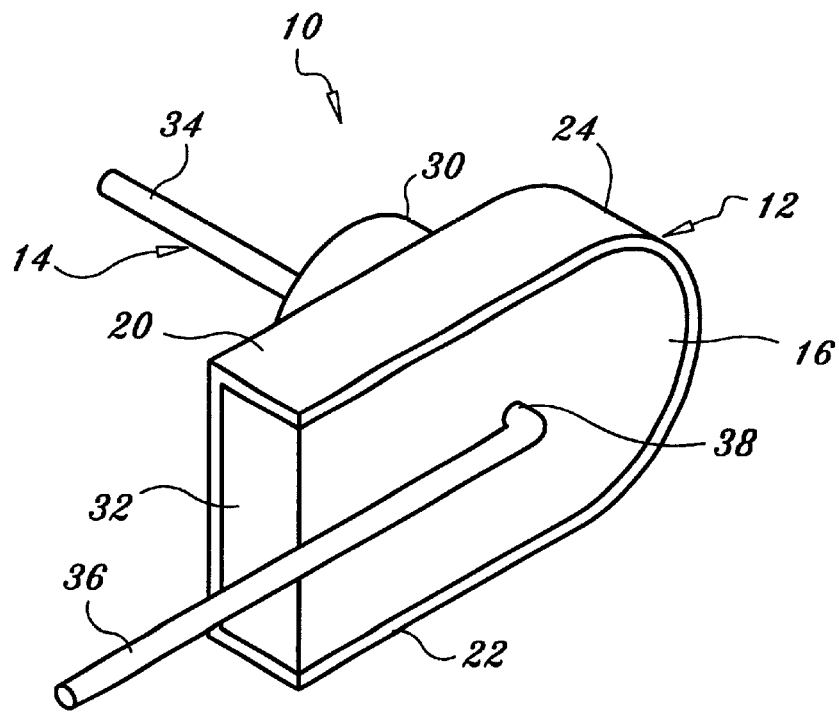
FIG. 2 shows a perspective view of the underside of the embodiment of FIG. 1.
Figure 3:
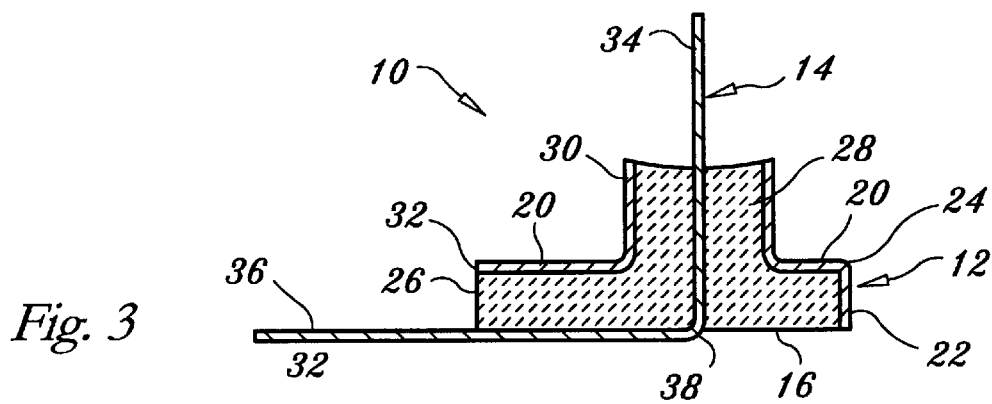
FIG. 3 shows a side cross-sectional view of the embodiment of FIG. 1.
Figure 4:
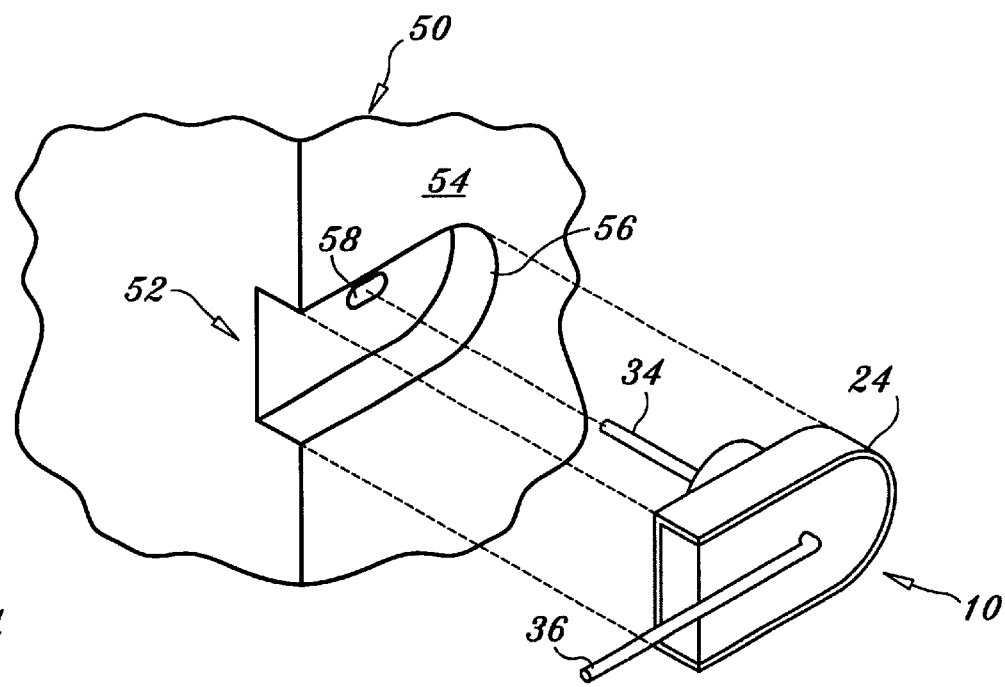
FIG. 4 shows an exploded view of the feedthrough of FIG. 1 as it fits into a microcircuit package.

In a preferred embodiment, the ferrule 12 includes a flat, generally rectangular horizontal floor 18. A lower wall 20 extends downward vertically from all but a small contiguous portion of the floor 18. Typically, the side 24 of the floor 18 opposite that of the side 26 without the wall will be rounded, generally into a semicircle. As shown in FIG. 4, the feedthrough 10 fits into a notch 52 in the lower surface 54 of the microcircuit package 50. In the typical manufacturing process, the notch 52 is machined out of the package 50 rather than molded into the package 50. It is much easier and more efficient to machine interior surfaces round rather than with squared-off corners. Consequently, the innermost wall 56 of the notch 52 is semicircular. In order for the feedthrough 10 to fit properly in the notch 52, the feedthrough wall 20 that mates to the semicircular notch wall 56 is also made semicircular.

The ferrule floor 18 includes an aperture 28. A tube 30 extends upwardly from the edge of the aperture 28. For the same reasons as given above for the round wall 56, it is much more efficient to machine a round hole into a package than any other shape, which is why the through bore 58 in the package 50 is round. In order for the feedthrough 10 to fit properly, the tube 30 is cylindrical, with an outside diameter that is slightly smaller than the diameter of the bore 58, and the aperture 28 is round. This preferred tube shape does not, however, preclude other shapes; the present invention contemplates any shape that is appropriate for the particular use of the feedthrough.

The lead 14 is the electrical conductor of the signal. It is an electrically-conductive wire that has a diameter appropriate to the electrical signal that it is to carry. Typically, the lead 14 is semirigid, that is, it retains the shape that is imparted onto it, such as by bending. For matched feedthroughs, the lead 14 is composed of the same material as the ferrule 12, for example, Kovar if the ferrule 12 is composed of Kovar. For compression feedthroughs, the lead 14 and or the ferrule [ ] may be composed of a wide variety of materials such as, but not limited to, ceramic, aluminum, nickel, kovar, or any other material which would serve the purpose.

The lead 14 has two portions, the internal portion 34 and the external portion 36, divided by an approximately 90 degree bend 38. The internal portion 34 extends though the tube 30, approximately coincident with the tube s axis. It extends far enough out of the tube 30 for its application, for example, to bond a wire to or to bond directly to the microcircuit. The external portion 36 is oriented so that it passes through the opening 32 defined by the floor 18 and the lower wall 20, and is offset from the floor 18 by an amount approximately equal to the height of the lower wall 20, leaving the axis of the external portion 36 approximately planar with the outer edge 22 of the lower wall 20. It extends far enough out of the opening 32 to perform as necessary, for example, to be soldered to a pad on a printed circuit board (PCB). When the lead 14 is oriented in such a manner, it does not make contact with the ferrule 12.

The insulator 16 prevents the ferrule 12 and lead 14 from making direct electrical contact and provides enough electrical isolation between the two to reduce crosstalk to acceptable levels. In addition, the insulator 16 hermetically seals the space between the ferrule 12 and the lead 14. In the present invention, the insulator 16 is preferably composed of heat-resistant glass. Glass is an extremely poor conductor of electricity, making it an excellent insulating material. Glass is also impermeable to the common and not-so-common liquids and gasses that the feedthrough will be exposed to in normal usage, making it an excellent sealing material.

The ferrule 12 and lead 14 are placed into a form that holds the two components in their correct positions relative to each other. A glass bead is set in the ferrule 12. The combination is passed through a heater that melts the glass, which then flows to fill the ferrule 12 and surround the lead 14. After the glass cools, the insulator 16 is formed. With a Kovar ferrule 12 and lead 14, as the components cool, they all contract at the same rate, providing a matched feedthrough. If a material with a coefficient of expansion greater than that of glass is used, a compression feedthrough is produced. If a material with a coefficient of expansion less than that of glass is used, the ferrule will contract less than the glass, leaving a gap between the ferrule and insulator, preventing a seal from forming.

Figure 5:
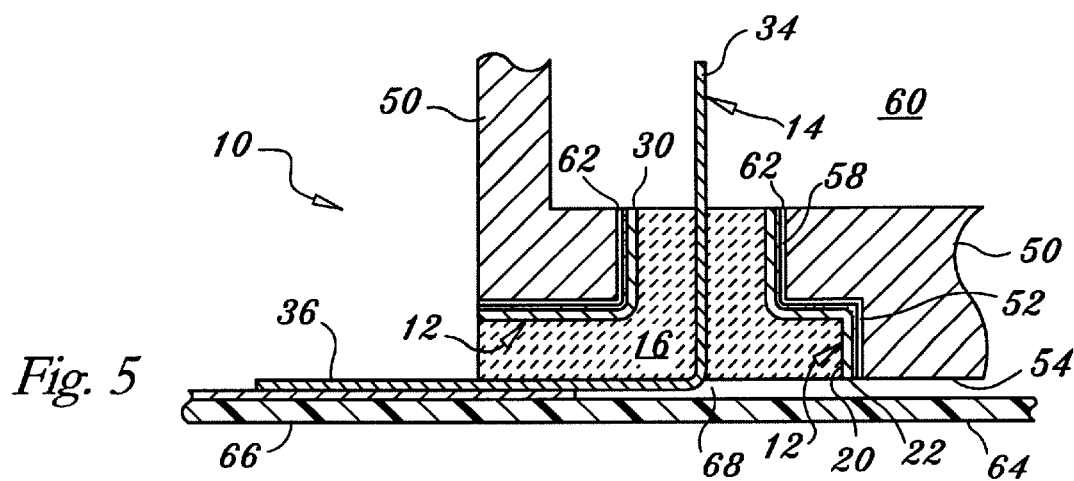
FIG. 5 shows a side cross-sectional view of the feedthrough of FIG. 1 as it fits into a microcircuit package on a printed circuit board.

FIG. 5 shows a cross-section of the feedthrough 10 of the present invention bonded into a microcircuit package 50 that is mounted on a PCB 64. As described above, the feedthrough 10 fits into a notch 52 in the bottom surface 54 of the package 50. The notch 52 is formed to mate with the feedthrough 10 such that the tube 30 fits into a bore 58 that extends into the package interior 60 and the ferrule floor 18 acts as a stop to prevent the feedthrough 10 tram extending too far into the package interior 60. Generally, the lower wall outer edge 22 will be even with the package bottom surface 54. However, this will not necessarily be the case. It is possible that the notch 52 will be deeper than the height of the lower wall 20. Consequently, the present invention contemplates that the lead bend 38 extends far enough away from the aperture 28 so that the external portion 36 is approximately planar with the package bottom surface 54.

After the feedthrough 10 is in position in the notch 52, it is permanently bonded into place so that the ferrule 12 is in electrical contact with the package 50 and so that a seal is formed between the ferrule 12 and the package 50, The bond 62 may be formed by solder, epoxy, or any other method that provides a permanent and electrically-conductive bond. When the feedthrough 10 is bonded into place, the lead internal portion 34 extends vertically into the package interior 60 and the external portion 36 extends outwardly from the package 50. The external portion 36 is approximately coplanar with the bottom surface 54 of the package 50 so that when the package 50 is laid on the PCB 64, the external portion 36 lays flat against the PCB pad 66, where it is soldered to the pad 66. In the preferred configuration, the external portion 36 is slightly lower than the bottom surface 54 so that when the package is resting on the PCB 64, there is a gap 68 between the bottom surface 54 and the PCB 64. This allows a small amount of solder to flow under the package 50, providing a better bond between the package 50 and the PCB 64.

Thus it has been shown and described a feedthrough which satisfies the objects set forth above.

Since certain changes may be made in the present disclosure without departing from the scope of the present invention, it is intended that all matter described in the foregoing specification and shown in the accompanying drawings be interpreted as illustrative and not in a limiting sense.

What is claimed is:

1. A surface mount feedthrough for use in surface mount microcircuit packages, comprising:
    a ferrule, composed of a ring of electrically-conductive, low-coefficient-of-expansion metal, further comprising a rectangular floor having at least one side with a vertical wall extending from all but a small contiguous portion of said floor;
    a lead, positioned internal and external of said ferrule bent through said ferrule at an approximate angle of ninety degrees, wherein there is a space between said ferrule and said lead; and
    an insulator, hermetically sealing said space between said ferrule and said lead.

2. The apparatus a claimed in claim 1, wherein said side of said floor of said ferrule, opposite said small contiguous portion of said floor, is rounded.

3. The apparatus as claimed in claim 1, wherein said ferrule has a cylindrical tube.

4. The apparatus as claimed in claim 3, wherein said lead has an internal portion extending through said tube, approximately coincident with the axis of said tube.

5. The apparatus of claim 4, wherein said lead extends beyond said tube.

6. The apparatus as claimed in claim 1, wherein said ferrule is composed of an alloy 29% nickel, 17% cobalt, 0.3% manganese, and the remainder iron.

7. The apparatus as claimed in claim 1, wherein said ferrule is composed of a material with a coefficient of expansion comparable to that of heat-resistant glass.

8. The apparatus as claimed in claim 1, wherein said ferrule is composed of a material with a coefficient of expansion greater than said insulator.

9. The apparatus as claimed in claim 1, wherein said ferrule is composed of a stainless steel when used with a glass insulator.

10. The apparatus as claimed in claim 1, wherein said lead is semirigid.

11. The apparatus as claimed in claim 1, wherein said lead has an external portion extending through said small contiguous portion of said floor.

12. The apparatus as claimed in claim 11, wherein said external portion is offset from said floor by an amount approximately equal to the height of said vertical wall.

* * * * *